US012796334B2

(12) United States Patent
Lee et al.

(10) Patent No.: US 12,796,334 B2
(45) Date of Patent: Nov. 10, 2026

(54) MAGNETORESISTIVE MEMORY DEVICE AND SEMICONDUCTOR DEVICE INCLUDING THE SAME

(71) Applicant: SAMSUNG ELECTRONICS CO., LTD., Suwon-si (KR)

(72) Inventors: Yoonyoung Lee, Suwon-si (KR); Sanghwan Park, Suwon-si (KR); Yongsung Park, Suwon-si (KR); Jeongheon Park, Suwon-si (KR); Hyeonwoo Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 669 days.

(21) Appl. No.: 18/118,571

(22) Filed: Mar. 7, 2023

(65) Prior Publication Data

US 2023/0371392 A1 Nov. 16, 2023

(30) Foreign Application Priority Data

May 11, 2022 (KR) ........................ 10-2022-0057806

(51) Int. Cl.

| | |
|---|---|
| ***H10N 50/10*** | (2023.01) |
| ***H10B 61/00*** | (2023.01) |
| ***H10B 80/00*** | (2026.01) |
| ***H10N 50/85*** | (2023.01) |
| ***H10W 20/41*** | (2026.01) |
| ***H10W 90/00*** | (2026.01) |

(52) U.S. Cl.

CPC ............. *H10N 50/10* (2023.02); *H10B 61/22* (2023.02); *H10B 80/00* (2023.02); *H10N 50/85* (2023.02); *H10W 20/435* (2026.01); *H10W 90/00* (2026.01)

(58) Field of Classification Search

None

See application file for complete search history.

(56) References Cited

U.S. PATENT DOCUMENTS

| | | | |
|---|---|---|---|
| 10,522,590 | B2 | 12/2019 | Satoh et al. |
| 10,522,752 | B1 | 12/2019 | Jan et al. |

(Continued)

FOREIGN PATENT DOCUMENTS

| | | | |
|---|---|---|---|
| KR | 10-2013-0103125 | A | 9/2013 |
| KR | 10-2016-0059297 | A | 5/2016 |
| KR | 10-2019-0066390 | A | 6/2019 |

OTHER PUBLICATIONS

Office Action issued by Korean Patent Office dated Oct. 7, 2026 in Application No. 10-2022-0057806.

*Primary Examiner* — Julio J Maldonado
*Assistant Examiner* — Pinaki Das
(74) *Attorney, Agent, or Firm* — Sughrue Mion, PLLC

(57) ABSTRACT

A magnetoresistive memory device includes: a lower electrode; a lower magnetic material layer on the lower electrode; a tunnel barrier layer on the lower magnetic material layer; an upper magnetic material layer on the tunnel barrier layer; a cap structure, on the upper magnetic material layer, including first layers and second layers, alternately layered; a cap conductive layer on the cap structure; and an upper electrode on the cap conductive layer, wherein the first layers include a first material including a non-magnetic material, and the second layers include a second material including a magnetic material.

19 Claims, 7 Drawing Sheets

100A

(56) References Cited

U.S. PATENT DOCUMENTS

| | | | | |
|---|---|---|---|---|
| 2010/0109109 | A1* | 5/2010 | Chen | H10N 50/10 257/E29.323 |
| 2013/0234267 | A1* | 9/2013 | Kim | H10D 48/40 257/421 |
| 2015/0008547 | A1* | 1/2015 | Pi | H10N 50/01 257/421 |
| 2016/0141496 | A1 | 5/2016 | Park et al. | |
| 2019/0019944 | A1 | 1/2019 | Sato et al. | |
| 2019/0173001 | A1* | 6/2019 | Lee | H10N 50/85 |
| 2019/0378972 | A1* | 12/2019 | Rahman | H10N 50/01 |
| 2020/0006631 | A1 | 1/2020 | Sato et al. | |

* cited by examiner

MAGNETORESISTIVE MEMORY DEVICE AND SEMICONDUCTOR DEVICE INCLUDING THE SAME

CROSS-REFERENCE TO RELATED APPLICATION(S)

This application claims priority to Korean Patent Application No. 10-2022-0057806 filed on May 11, 2022 in the Korean Intellectual Property Office, the disclosure of which is incorporated herein by reference in its entirety.

BACKGROUND

The disclosure relates to a magnetoresistive memory device and a semiconductor device including the same.

A magnetoresistive memory device may be a non-volatile memory device for reading and writing data using a magnetic tunnel junction pattern including two magnetic materials and an insulating layer interposed therebetween. A resistance value of the magnetic tunnel junction pattern may be changed according to magnetization directions of the two magnetic materials, and data may be programmed or erased using a difference in resistance values.

SUMMARY

An aspect of the disclosure is to provide a magnetoresistive memory device having improved electrical characteristics and reliability, and a semiconductor device including the same.

According to an aspect of the disclosure, a magnetoresistive memory device may include: a lower electrode; a lower magnetic material layer on the lower electrode; a tunnel barrier layer on the lower magnetic material layer; an upper magnetic material layer on the tunnel barrier layer; a cap structure, on the upper magnetic material layer, including first layers and second layers, alternately layered; a cap conductive layer on the cap structure; and an upper electrode on the cap conductive layer, wherein the first layers include a first material including a non-magnetic material, and the second layers include a second material including a magnetic material.

According to an aspect of the disclosure, a magnetoresistive memory device may include: a lower electrode; a lower magnetic material layer on the lower electrode; a tunnel barrier layer on the lower magnetic material layer; an upper magnetic material layer on the tunnel barrier layer; a cap structure, on the upper magnetic material layer, including an amorphous oxide; a cap conductive layer on the cap structure; and an upper electrode on the cap conductive layer, wherein the cap structure has a greater thickness than the upper magnetic material layer.

According to an aspect of the disclosure, a semiconductor device may include a logic circuit region on a substrate; an interconnection region on the logic circuit region; and a magnetoresistive memory region in the interconnection region, wherein the logic circuit region includes impurity regions in the substrate and gate electrodes on the substrate, the interconnection region includes contact plugs and interconnections, electrically connected to the impurity regions, and the magnetoresistive memory region includes an interlayer insulating layer, and a plurality of magnetoresistive memory devices, in the interlayer insulating layer, electrically connected to the contact plugs, respectively, wherein each of the plurality of magnetoresistive memory devices includes a lower electrode, a lower magnetic material layer on the lower electrode, a tunnel barrier layer on the lower magnetic material layer, an upper magnetic material layer on the tunnel barrier layer, a cap structure on the upper magnetic material layer, a cap conductive layer on the cap structure, and an upper electrode on the cap conductive layer, wherein the cap structure includes multilayer structures of oxide in which a unit structure including a first layer and a second layer is repeatedly stacked at least twice, wherein the first layer includes a first material including a non-magnetic material, and the second layer includes a second material including a magnetic material.

According to an aspect of the disclosure, a method of manufacturing a magnetoresistive memory device is provided. The method may include: forming a lower magnetic material layer; forming a tunnel barrier layer on the lower magnetic material layer; forming an upper magnetic material layer on the tunnel barrier layer; and forming a cap structure on the upper magnetic material layer, wherein the forming a cap structure includes alternately laminating non-magnetic material layers and magnetic material layers; and oxidizing at least one of the non-magnetic material layers and the magnetic material layers.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, example embodiments of the disclosure will be described with reference to the accompanying drawings.

It will be understood that when an element or layer is referred to as being “over,” “above,” “on,” “below,” “under,” “beneath,” “connected to” or “coupled to” another element or layer, it can be directly over, above, on, below, under, beneath, connected or coupled to the other element or layer or intervening elements or layers may be present. In contrast, when an element is referred to as being “directly over,” “directly above,” “directly on,” “directly below,” “directly under,” “directly beneath,” “directly connected to” or “directly coupled to” another element or layer, there are no intervening elements or layers present Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b and c," should be understood as including only a, only b, only c, both a and b, both a and c, both b and c, or all of a, b and c.

Figure 1:
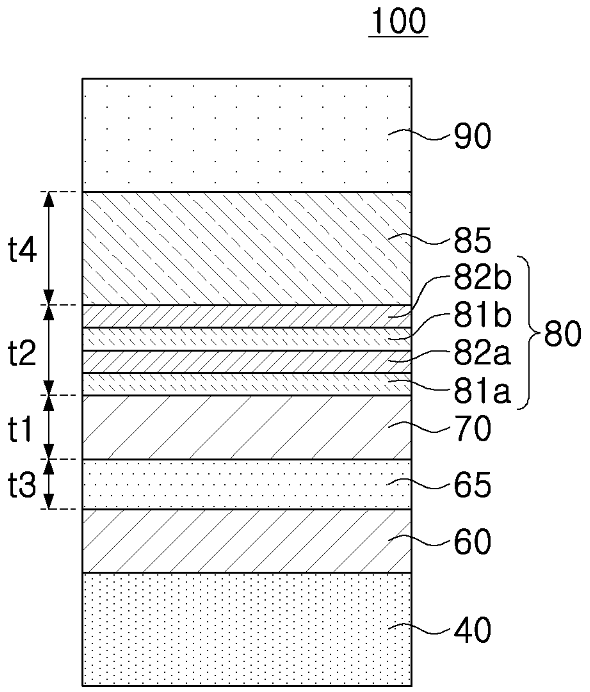
FIG. 1 is a schematic cross-sectional view of a magnetoresistive memory device according to example embodiments.

FIG. 1 is a schematic cross-sectional view of a magnetoresistive memory device, according to example embodiments.

Referring to FIG. 1, a magnetoresistive memory device 100 may include a lower electrode 40, a lower magnetic material layer 60, a tunnel barrier layer 65, an upper magnetic material layer 70, a cap structure 80, a cap conductive layer 85 and an upper electrode 90, sequentially stacked. The lower magnetic material layer 60, the tunnel barrier layer 65 and the upper magnetic material layer 70 may constitute a magnetic tunnel junction pattern.

The lower electrode 40 may be disposed below the lower magnetic material layer 60. The lower electrode 40 may include a conductive material, and the conductive material may include at least one of a semiconductor material (e.g., silicon, germanium, silicon germanium, or the like) including one or more dopants, a conductive metal nitride (e.g., titanium nitride, tantalum nitride, tungsten nitride, or the like), and a metal (e.g., tungsten, titanium, tantalum, cobalt, aluminum, ruthenium, or the like) or metal compound. The lower electrode 40 may include one or more conductive layers.

The lower magnetic material layer 60 may be disposed on the lower electrode 40. The lower magnetic material layer 60 may include a pinned layer having a pinned magnetization direction. For example, the pinned layer may have perpendicular magnetic anisotropy in which a magnetization direction is fixed in a vertical direction, for example, in a direction perpendicular to an extension direction of the pinned layer, or may have in-plane magnetic anisotropy in which a magnetization direction is fixed in a horizontal direction, for example, in a direction, parallel to the extension direction of the pinned layer.

The lower magnetic material layer 60 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. For example, the lower magnetic material layer 60 may be a CoFeB film.

The tunnel barrier layer 65 may be disposed on the lower magnetic material layer 60, and may separate the lower magnetic material layer 60 from the upper magnetic material layer 70. The tunnel barrier layer 65 may enable quantum tunneling between the lower magnetic material layer 60 and the upper magnetic material layer 70. A thickness t3 of the tunnel barrier layer 65 may be, for example, from about 0.1 nm to about 1 nm. The thickness t3 of the tunnel barrier layer 65 may be about 0.1 nm to about 0.9 nm.

The tunnel barrier layer 65 may include at least one of magnesium oxide (MgO), aluminum oxide ($Al_2O_3$), silicon oxide ($SiO_2$), boron oxide ($B_2O_3$), tantalum oxide ($Ta_2O_5$), silicon nitride ($SiN_x$) or aluminum nitride ($AlN_x$). For example, the tunnel barrier layer 65 may be a magnesium oxide (MgO) film.

The upper magnetic material layer 70 may be disposed on the tunnel barrier layer 65. The upper magnetic material layer 70 may have a magnetization easy axis in the vertical direction or the horizontal direction, and may include a free layer having a variable magnetization direction due to magnetization rotation and magnetic domain wall movement. A magnetization direction of the free layer may be changed by spin transfer torque. For example, magnetization of the free layer of the upper magnetic material layer 70 may be changed by a switching current applied to the magnetic tunnel junction pattern through the upper and lower electrodes 40 and 90. When magnetization directions of the lower magnetic material layer 60 and the upper magnetic material layer 70 are parallel to each other, the magnetic tunnel junction pattern may exhibit a low-resistance state, and when magnetization directions of the lower magnetic material layer 60 and the upper magnetic material layer are anti-parallel to each other, the magnetic tunnel junction pattern may exhibit a high-resistance state. A non-volatile memory device may be implemented using such a spin polarized current.

The upper magnetic material layer 70 may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof. For example, the upper magnetic material layer 70 may be a CoFeB film. After the upper magnetic material layer 70 is formed in an amorphous state, the upper magnetic material layer 70 may be heat-treated to have a body-centered cubic (BCC) crystal structure, according to a crystal structure of the tunnel barrier layer 65.

The cap structure 80 may be disposed on the upper magnetic material layer 70. The cap structure 80 may include first layers 81*a* and 81*b*, and second layers 82*a* and 82*b*, alternately layered. The first layers 81*a* and 81*b* may include a first material which may be a non-magnetic material, and the non-magnetic material may include tantalum (Ta), tungsten (W), molybdenum (Mo), zirconium (Zr), rhodium (Rh), iridium (Ir), chromium (Cr), vanadium (V), rhenium (Re), ruthenium (Ru), niobium (Nb) or a combination thereof. The first material may be oxidized to form a part of the cap structure 80. The second layers 82*a* and 82*b* may include a second material which may be a magnetic material, and the magnetic material may include CoFeB, CoFeTb, FePt, Co/Pd, Co/Pt, CoFeNi, CoFeCr, CoFeBSi, CoFeBCr, CoFeBAl, CoFeBV, FeB, FeNi, FeTa or a combination thereof. The second material may be oxidized to form a part of the cap structure 80.

The cap structure 80 may include multilayer structures of oxide in which a unit structure including a first layer and a second layer is repeatedly stacked at least twice. For example, the cap structure 80 may include multilayer structures of oxide of Ta/CoFeB/Ta/CoFeB. Compared to when the cap structure 80 is provided as a single layer, the cap structure 80 may be implemented as multilayer structures, to control oxidation due to constituent film components of the multilayer structures, and to form a relatively thick and uniform amorphous oxide film. Accordingly, since interfacial vertical anisotropy distribution on a wafer may be improved by the cap structure 80, coercivity distribution of the magnetic tunnel junction pattern may be improved. Therefore, electrical characteristics and reliability of the magnetoresistive memory device 100 may be improved.

As confirmed by the inventors of the present application, when compared to a comparative example in which the cap structure 80 is implemented as a single layer, the cap structure 80 may be implemented as multilayer structures, to relatively increase a tunneling magneto-resistance ratio (TMR ratio), and to relatively decrease a paralleled resistance (Rp) value.

The cap structure 80 may have a thickness t2, which is greater than a thickness t1 of the upper magnetic material layer 70. In an example, the thickness t2 may be smaller than or equal to about 1.5 times the first thickness t1. In an example, the thickness t2 may be smaller than or equal to about twice the thickness t1. The thickness t1 may be about 1 nm to about 1.5 nm, and the thickness t2 may be about 1.5 nm to about 2 nm, but the disclosure is not limited thereto. A thickness of each of the first and second layers 81*a*, 81*b*, 82*a* and 82*b* constituting the cap structure 80 may be smaller than the thickness t1 of the upper magnetic material layer 70, and may be smaller than the thickness t3 of the tunnel barrier layer 65.

Since a relationship between the thicknesses of the first layers 81*a* and 81*b* of the cap structure 80 and the coercivity of the magnetic tunnel junction pattern and a relationship between the thicknesses of the second layers 82*a* and 82*b* and the coercivity of the magnetic tunnel junction pattern have been confirmed, the thicknesses of the first and second layers 81*a*, 81*b*, 82*a* and 82*b* may be adjusted or controlled according to desired electrical characteristics of the magnetoresistive memory device 100.

Formation of the cap structure 80 may include alternately depositing a non-magnetic material layer and a magnetic material layer one after another on the upper magnetic material layer 70, and oxidizing at least one of the non-magnetic material layers and the magnetic material layers. The alternately depositing non-magnetic material layers and magnetic material layers may use a physical vapor deposition (PVD) process or a chemical vapor deposition (CVD) process. In some embodiments, the deposition may be performed using a sputtering process using an inert gas such as Ar, Kr, or the like. The oxidizing at least one of the non-magnetic material layers and the magnetic material layers may include performing a heat treatment process. In oxidizing at least one of the non-magnetic material layers and the magnetic material layers, at least a portion of layers located in a lower portion of the cap structure 80 or at least a portion of a layer located in the lower portion may not be oxidized.

Types and concentration distributions (or profiles) of elements included in material layers constituting the cap structure 80 may be inspected by energy dispersive X-ray spectroscopy, X-ray fluorescence spectrometry (XRF), X-ray photoelectron spectrometry (XPS), secondary ion mass spectrometry (SIMS), or the like.

The cap conductive layer 85 may be disposed on the cap structure 80. The cap conductive layer 85 may have a thickness t4, greater than the thickness t1 of the upper magnetic material layer 70 and the thickness t2 of the cap structure 80. The thickness t4 of the cap conductive layer 85 may be, for example, about 3 nm to about 10 nm. The thickness t4 of the cap conductive layer 85 may be, for example, about 4 nm to about 6 nm. The cap conductive layer 85 may include Ta, W, Mo, Zr, Rh, Ir, Cr, V, Re, Co, Ru, Nb, or a combination thereof.

The upper electrode 90 may be disposed on the cap structure 80 and the cap conductive layer 85. The upper electrode 90 may include a conductive material, and the conductive material may include at least one of a semiconductor material (e.g., silicon, germanium, silicon germanium, or the like) including one or more dopants, a conductive metal nitride (e.g., titanium nitride, tantalum nitride, tungsten nitride, or the like), and a metal (e.g., tungsten, titanium, tantalum, cobalt, aluminum, ruthenium, or the like) or metal compound. The upper electrode 90 may include one or more conductive layers.

FIGS. 2 to 6 are schematic cross-sectional views of magnetoresistive memory devices, according to example embodiments.

Figure 2:
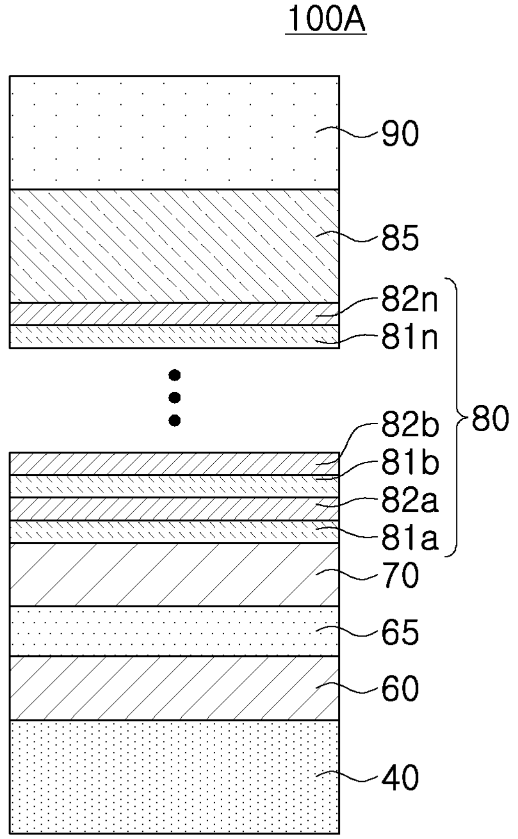
FIGS. 2 to 6 are schematic cross-sectional views of magnetoresistive memory devices, according to example embodiments.

Referring to FIG. 2, a cap structure 80 of a magnetoresistive memory device 100A may have a structure in which at least three first layers 81*a*, 81*b*, . . . , 81*n* and at least three second layers 82*a*, 82*b*, . . . , 82*n* are alternately stacked. For example, the cap structure 80 may include multiple layers of Ta/CoFeB/Ta/CoFeB/ . . . /Ta/CoFeB and oxidized. Thicknesses of the first layers 81*a*, 81*b*, . . . , 81*n* may be equal to or different from each other, and thicknesses of the second layers 82*a*, 82*b*, . . . , 82*n* may be equal to or different from each other.

Figure 3:
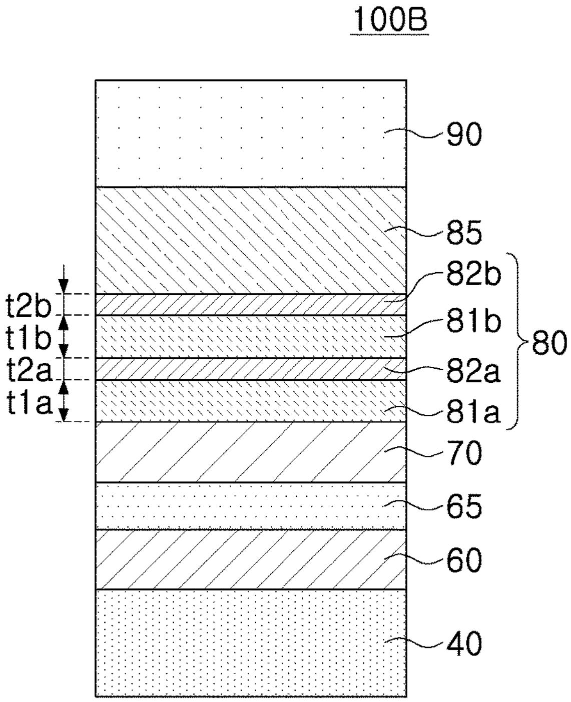

Referring to FIG. 3, in a cap structure 80 of a magnetoresistive memory device 100B, a thickness of at least one of first layers 81*a* and 81*b* may be greater than a thickness of at least one of second layers 82*a* and 82*b*. For example, a thickness t1a of a first lower layer 81*a* and a thickness t1b of a first upper layer 81*b* may be greater than a thickness t2a of a second lower layer 82*a* and a thickness t2b of a second upper layer 82*b*, respectively. The thickness t1a of the first lower layer 81*a* and the thickness t1b of the first upper layer 81*b* may be equal to each other, but may be different from each other in other examples.

Figure 4:
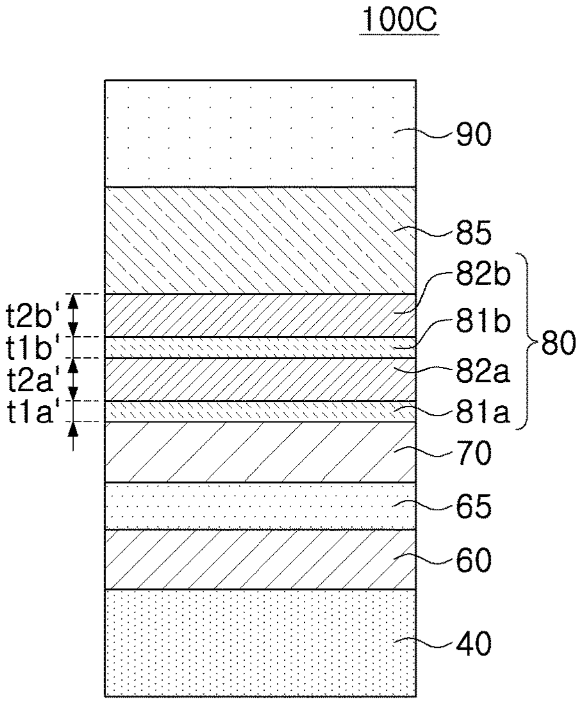

Referring to FIG. 4, in a cap structure 80 of a magnetoresistive memory device 100C, a thickness of at least one of second layers 82*a* and 82*b* may be greater than a thickness of at least one of first layers 81*a* and 81*b*. For example, a thickness t2a' of a second lower layer 82*a* and a thickness t2b' of a second upper layer 82*b* may be greater than a thickness t1a' of a first lower layer 81*a* and a thickness t1b' of a first upper layer 81*b*. The thickness t2a' of the second lower layer 82*a* and the thickness t2b' of the second upper layer 82*b* may be equal to each other, but may be different from each other in other examples.

Figure 5:
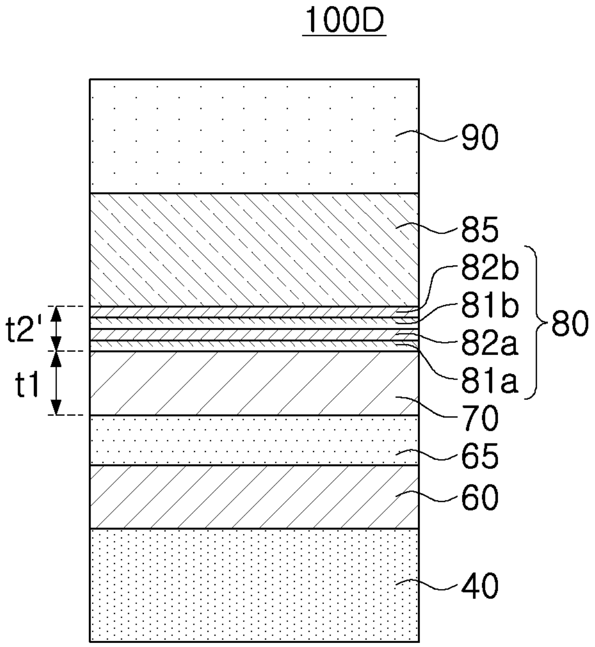

Referring to FIG. 5, a thickness of respective layers 81*a*, 81*b*, 82*a* and 82*b* constituting a cap structure 80 of a magnetoresistive memory device 100D may be smaller than a thickness t1 of an upper magnetic material layer 70. A thickness t2' of the cap structure 80, which is a sum of thicknesses of the layers 81*a*, 81*b*, 82*a*, and 82*b*, may be smaller than the thickness t1 of the upper magnetic material layer 70.

Figure 6:
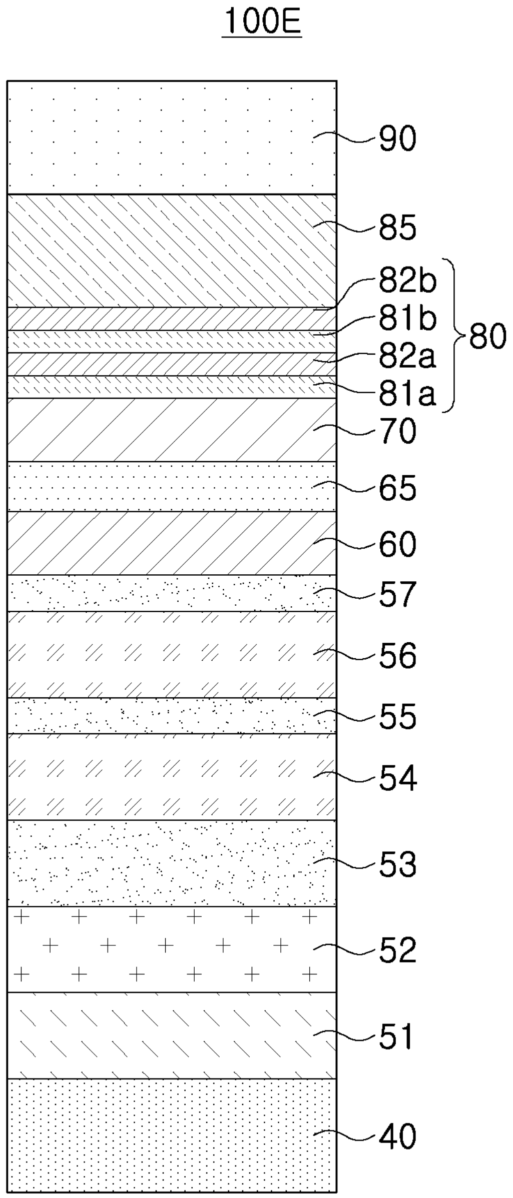

Referring to FIG. 6, a magnetoresistive memory device 100E may further include a plurality of layers 51, 52, 53, 54, 55, 56 and 57 between a lower electrode 40 and a lower magnetic material layer 60. Each of the plurality of layers 51, 52, 53, 54, 55, 56 and 57 may include a single material layer or a combination material layer of Ta, W, Mo, Zr, Rh, Ir, Cr, V, Re, Co, Ru, Nb, Fe and B. As an example, the plurality of layers 51, 52, 53, 54, 55, 56 and 57 may have a stack structure of Ta/Ru/Ir/Co/Ir/Co/MoCoFe, but the disclosure is not limited thereto. According to example embodiments, the number of layers forming the plurality of layers 51, 52, 53, 54, 55, 56 and 57 and/or a type of film quality thereof may be variously changed.

Figure 7A:
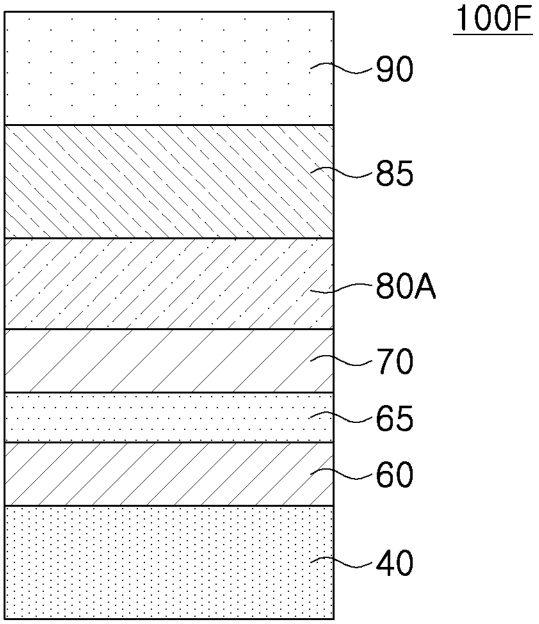
FIG. 7A is a schematic cross-sectional view of a magnetoresistive memory device, according to example embodiments.
Figure 7B:
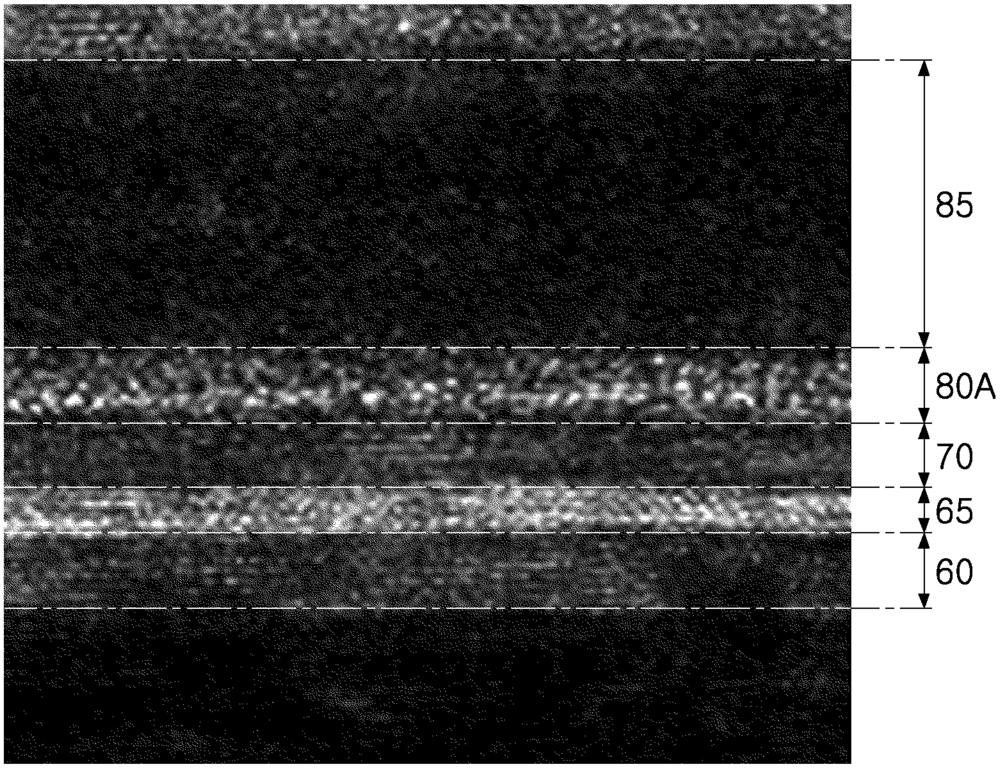
FIG. 7B is a transmission electron microscope (TEM) image illustrating a region including a magnetic tunnel junction pattern of a magnetoresistive memory device.

FIG. 7A is a schematic cross-sectional view of a magnetoresistive memory device, according to example embodiments, and FIG. 7B is a transmission electron microscope (TEM) image illustrating a region including a magnetic tunnel junction pattern of a magnetoresistive memory device.

Referring to FIG. 7A, a cap structure 80A of a magnetoresistive memory device 100F may include an amorphous oxide, and the amorphous oxide may be multilayer structures of oxide of Ta/CoFeB/Ta/CoFeB, or may be multilayer structures of oxide of Ta/CoFeB/Ta/CoFeB/ . . . /Ta/CoFeB/Ta/CoFeB.

Referring to FIG. 7B, a lower magnetic material layer 60, a tunnel barrier layer 65, an upper magnetic material layer 70, a cap structure 80A, and a cap conductive layer 85, corresponding to the magnetoresistive memory device 100F of FIG. 7A, are shown. The upper and lower magnetic material layers 60 and 70 had a single crystal or polycrystalline structure, but the cap structure 80A had a relatively thick amorphous state, compared to a single layer.

Figure 8:
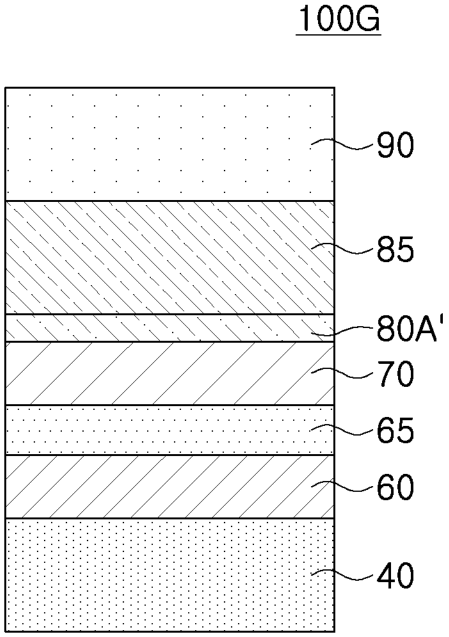
FIG. 8 is a schematic cross-sectional view of a magnetoresistive memory device, according to example embodiments.

FIG. 8 is a schematic cross-sectional view of a magnetoresistive memory device, according to example embodiments.

Referring to FIG. 8, a cap structure 80A' of a magnetoresistive memory device 100G may include an amorphous oxide, and the amorphous oxide may be multilayer structures of oxide of Ta/CoFeB/Ta/CoFeB. Unlike the embodiment of 7A, a thickness of the cap structure 80A' may be smaller than a thickness of an upper magnetic material layer 70.

Figure 9A:
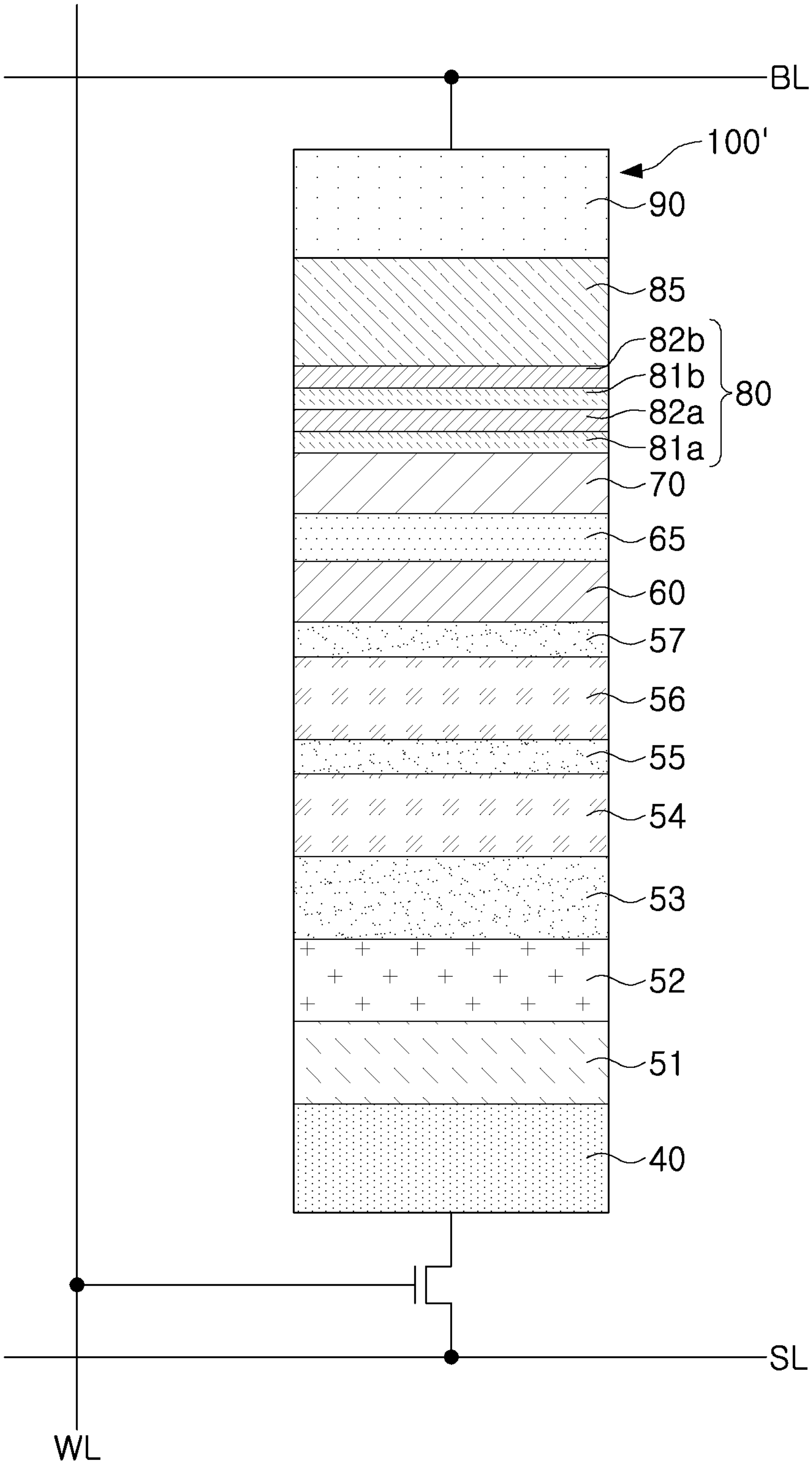
FIG. 9A is a view illustrating a configuration of a magnetoresistive memory device, according to example embodiments.

FIG. 9A is a view illustrating a configuration of a magnetoresistive memory device, according to example embodiments.

Referring to FIG. 9A, a lower electrode 40 of a magnetoresistive memory device 100' may be electrically connected to a drain terminal of a transistor, and an upper electrode 90 may be electrically connected to a bit line BL. A source terminal of the transistor may be electrically connected to a source line SL, and a gate terminal of the transistor may be electrically connected to a word line WL.

Figure 9B:
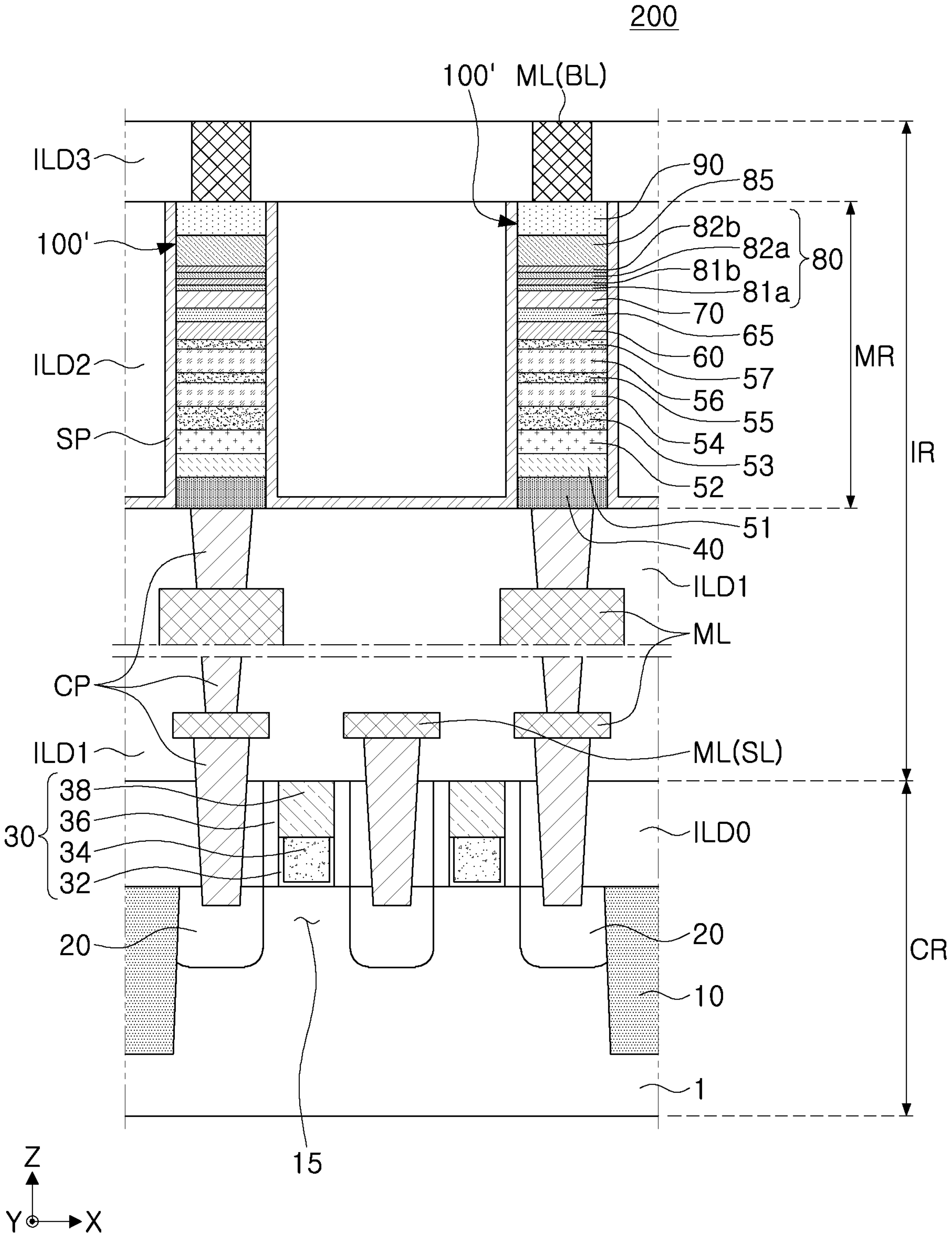
FIG. 9B is a schematic cross-sectional view of a semiconductor device including a magnetoresistive memory device, according to example embodiments.

FIG. 9B is a schematic cross-sectional view of a semiconductor device including a magnetoresistive memory device, according to example embodiments.

Referring to FIG. 9B, a semiconductor device 200 including a magnetoresistive memory device 100' may be provided. The semiconductor device 200 may include a substrate 1, a logic circuit region CR on the substrate, an interconnection region IR on the logic circuit region CR, and a magnetoresistive memory region MR in the interconnection region IR.

The logic circuit region CR may include an active region 15 defined by a device isolation layer 10 in the substrate 1, a gate structure 30 on the active region 15, and impurity regions 20 disposed in the active region 15 on both sides of the gate structure 30. As an example, the logic circuit region CR may include a planar transistor, or a fin field-effect transistor (FinFET) in which an active region 15 has a fin structure, and may include, as another example, a multi-bridge channel FET (MBCFET™), a gate-all-around field effect transistors (GAAFET), or a nanosheet transistor. In another example, the logic circuit region CR may include a buried channel array transistor (BCAT) configured around a buried gate structure intersecting an active region 15 and buried and extending in a substrate 1.

The substrate 1 may include a semiconductor material, such as a group IV semiconductor, a group III-V compound semiconductor, or a group II-VI compound semiconductor. For example, the group IV semiconductor may include silicon, germanium, or silicon-germanium. The substrate 1 may further include impurities. The substrate 1 may be a silicon substrate, a silicon-on-insulator (SOI) substrate, a germanium substrate, a germanium-on-insulator (GOI) substrate, a silicon-germanium substrate, or a substrate including an epitaxial substrate.

The device isolation layer 10 may define the active region 15 in the substrate 1. The device isolation layer 10 may be formed by, for example, a shallow trench isolation (STI) process. The device isolation layer 10 may include an insulating material, for example, at least one of silicon oxide, silicon nitride, silicon oxynitride, or silicon oxycarbide. The active region 15 may be defined by the device isolation layer 10, and may extend in one direction. The active region 15 may have a structure protruding from the substrate 1.

The impurity regions 20 may be disposed in the active region 15 on both sides of the gate structure 30. The impurity regions 20 may serve as a source region or a drain region of transistors. The impurity regions 20 may include N-type or P-type dopants or impurities. The impurity regions 20 may be epitaxial layers grown from a region in which a fin pattern of the active region 15 is partially removed.

The gate structure 30 may extend in a direction, intersecting the active region 15. The gate structure 30 may include a gate dielectric layer 32, a gate electrode 34, a gate spacer 36, and a gate capping layer 38.

The gate dielectric layer 32 may be disposed between the active region 15 and the gate electrode 34, and may include an oxide, a nitride, or a high-x material. The high-x material may refer to a dielectric material having a dielectric constant, higher than a dielectric constant of a silicon oxide.

The gate electrode 34 may include a conductive material, for example, at least one of W, Ti, Ta, Mo, TiN, TaN, WN, TiON, TiAlC, TiAlN, or TaAlC. The gate electrode 34 may include a semiconductor material such as doped polysilicon. The gate electrode 34 may be constituted as two or more multilayer structures.

The gate spacer 36 may be disposed on both sides of the gate electrode 34. The gate spacer 36 may include at least one of SiO, SiN, SiCN, SiOC, SiON, or SiOCN, and may include a plurality of layers.

The gate capping layer 38 may be disposed on an upper surface of the gate electrode 34, and may be formed of, for example, silicon oxide, silicon nitride, silicon oxynitride, or a combination thereof.

The interconnection region IR may include contact plugs CP and interconnection structures ML, electrically connected to the impurity regions 20. A portion of the contact plugs CP may extend into an interlayer insulating structure ILD0 in the logic circuit region CR, to be directly connected to the impurity regions 20, or may be directly connected to the gate electrode 34. The contact plugs CP and the interconnection structures ML may be disposed in a first interlayer insulating structure ILD1 including a plurality of insulating layers. A portion of the contact plugs CP may be directly connected to a lower electrode 40 of the magnetoresistive memory device 100'. The interconnection structures ML may include a source line SL. The interconnection structures ML may include bit lines BL disposed in a third interlayer insulating structure ILD3 on the magnetoresistive memory devices 100'.

The magnetoresistive memory region MR may include a second interlayer insulating structure ILD2, a magnetoresistive memory devices 100' in the second interlayer insulating structure ILD2, and a spacer SP covering side surfaces of the second interlayer insulating structure ILD2.

The magnetoresistive memory devices 100' is illustrated as a structure, equal to the magnetoresistive memory device 100E of FIG. 6, but may have the structure of any one of the magnetoresistive memory devices of FIGS. 1 to 5, and 7A to 8. Each of the magnetoresistive memory devices 100' may include a cap structure 80, and the cap structure 80 may be alternately layered with first layers 81*a* and 81*b* and second layers 82*a* and 82*b*. The cap structure 80 may include multilayer structures of oxide of Ta/CoFeB/Ta/CoFeB in an amorphous state.

The spacers SP may be disposed in the second interlayer insulating structure ILD2, and may be disposed on side surfaces of the magnetoresistive memory devices 100'. The spacers SP may prevent oxidation of a material layer constituting the 'magnetic tunnel junction pattern' of the magnetoresistive memory devices 100'.

A magnetoresistive memory device having improved electrical characteristics and reliability, and a semiconductor device including the same may be provided by disposing a cap structure including multilayer structures of oxide layered on a magnetic material layer.

Various advantages and effects of the disclosure are not limited to the above, and will be more easily understood in the process of describing specific embodiments of the disclosure.

While example embodiments have been shown and described above, it will be apparent to those skilled in the art that modifications and variations could be made without departing from the scope of the disclosure as defined by the appended claims.

What is claimed is:

1. A magnetoresistive memory device comprising:
a lower electrode;
a lower magnetic material layer on the lower electrode;
a tunnel barrier layer on the lower magnetic material layer;
an upper magnetic material layer on the tunnel barrier layer, the upper magnetic material layer having a variable magnetization direction;
a cap structure on the upper magnetic material layer, the cap structure comprising first oxide layers and second oxide layers which are alternately stacked;
a cap conductive layer on the cap structure; and
an upper electrode on the cap conductive layer,
wherein the first oxide layers comprise a first material comprising a non-magnetic material, and the second oxide layers comprise a second material comprising a magnetic material.

2. The magnetoresistive memory device of claim 1, wherein the non-magnetic material comprises tantalum (Ta).

3. The magnetoresistive memory device of claim 1, wherein the non-magnetic material comprises tungsten (W), molybdenum (Mo), zirconium (Zr), rhodium (Rh), iridium (Ir), chromium (Cr), vanadium (V), rhenium (Re), ruthenium (Ru), niobium (Nb), or a combination thereof.

4. The magnetoresistive memory device of claim 1, wherein the magnetic material comprises CoFeB, CoFeTb, FePt, Co/Pd, Co/Pt, CoFeNi, CoFeCr, CoFeBSi, CoFeBCr, CoFeBAl, CoFeBV, FeB, FeNi, FeTa, or a combination thereof.

5. The magnetoresistive memory device of claim 1, wherein each of a thickness of each of the first oxide layers and a thickness of each of the second oxide layers is smaller than a thickness of the upper magnetic material layer.

6. The magnetoresistive memory device of claim 1, wherein each of a thickness of each of the first oxide layers and a thickness of each of the second oxide layers is smaller than a thickness of the tunnel barrier layer.

7. The magnetoresistive memory device of claim 1, wherein a thickness of the cap structure is smaller than a thickness of the upper magnetic material layer.

8. The magnetoresistive memory device of claim 1, wherein a thickness of at least one of the first oxide layers is greater than a thickness of at least one of the second oxide layers.

9. The magnetoresistive memory device of claim 1, wherein a thickness of the cap conductive layer is greater than each of a thickness of the cap structure and a thickness of the upper magnetic material layer.

10. The magnetoresistive memory device of claim 1, wherein the first oxide layers and the second oxide layers comprise amorphous oxide having a multilayer structure of oxide of Ta/CoFeB/Ta or CoFeB/Ta/CoFeB.

11. A magnetoresistive memory device comprising:
a lower electrode;
a lower magnetic material layer on the lower electrode;
a tunnel barrier layer on the lower magnetic material layer;
an upper magnetic material layer on the tunnel barrier layer, the upper magnetic material layer having a variable magnetization direction;
a cap structure on the upper magnetic material layer, the cap structure comprising an amorphous oxide;
a cap conductive layer on the cap structure; and
an upper electrode on the cap conductive layer,
wherein the cap structure has a greater thickness than the upper magnetic material layer, and
wherein the amorphous oxide comprises a multilayer structure of oxide of Ta/CoFeB/Ta/CoFeB.

12. The magnetoresistive memory device of claim 11, wherein the multilayer structure comprises a unit structure comprising a first oxide layer and a second oxide layer is repeatedly stacked at least twice,
wherein the first oxide layer comprises a first material comprising a non-magnetic material, and
wherein the second oxide layer comprises a second material comprising a magnetic material.

13. The magnetoresistive memory device of claim 11, wherein the amorphous oxide is the multilayer structure of oxide of Ta/CoFeB/Ta/CoFeB/Ta/CoFeB.

14. The magnetoresistive memory device of claim 11, wherein the thickness of the cap structure is smaller than or equal to about twice the thickness of the upper magnetic material layer.

15. The magnetoresistive memory device of claim 11, wherein the cap conductive layer has a greater thickness than each of the upper magnetic material layer and the cap structure.

16. The magnetoresistive memory device of claim 11, further comprising:
a first interconnection electrically connected to the lower electrode; and
a second interconnection on the upper electrode and electrically connected to the upper electrode.

17. A semiconductor device comprising:
a logic circuit region on a substrate;
an interconnection region on the logic circuit region; and
a magnetoresistive memory region in the interconnection region, wherein the logic circuit region comprises impurity regions in the substrate and gate electrodes on the substrate, wherein the interconnection region comprises contact plugs and interconnections, electrically connected to the impurity regions, and wherein the magnetoresistive memory region comprises an interlayer insulating layer, and a plurality of magnetoresistive memory devices, in the interlayer insulating layer, electrically connected to the contact plugs, respectively, wherein each of the plurality of magnetoresistive memory devices comprises a lower electrode, a lower magnetic material layer on the lower electrode, a tunnel barrier layer on the lower magnetic material layer, an upper magnetic material layer on the tunnel barrier layer, the upper magnetic material layer having a variable magnetization direction, a cap structure on the upper magnetic material layer, a cap conductive layer on the cap structure, and an upper electrode on the cap conductive layer, wherein the cap structure comprises multilayer structures of oxide in which a unit structure comprising a first oxide layer and a second oxide layer is repeatedly stacked at least twice, wherein the first oxide layer comprises a first material comprising a non-magnetic material, and wherein the second oxide layer comprises a second material comprising a magnetic material.

18. The semiconductor device of claim 17, wherein the non-magnetic material comprises tantalum (Ta), wherein the magnetic material comprises CoFeB, wherein the lower magnetic material layer comprises CoFeB, wherein the upper magnetic material layer comprises CoFeB, and wherein the tunnel barrier layer comprises MgO.

19. The semiconductor device of claim 17, wherein a thickness of the cap structure is smaller than a thickness of the upper magnetic material layer.

* * * * *